(12) United States Patent
Campbell

(10) Patent No.: US 7,220,982 B2
(45) Date of Patent: May 22, 2007

(54) AMORPHOUS CARBON-BASED NON-VOLATILE MEMORY

(75) Inventor: Kristy A. Campbell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 72 days.

(21) Appl. No.: 10/899,010

(22) Filed: Jul. 27, 2004

(65) Prior Publication Data

US 2006/0022347 A1    Feb. 2, 2006

(51) Int. Cl.
*H01L 47/00* (2006.01)
*H01L 29/04* (2006.01)

(52) U.S. Cl. .......... 257/3; 257/4; 257/42; 257/E45.002; 257/2

(58) Field of Classification Search ............... 438/399, 438/128, 623, 745, 780; 275/295, 40; 365/148, 365/158, 189.07; 257/464, 448, 459, 446, 257/3
See application file for complete search history.

(56) References Cited

U.S. PATENT DOCUMENTS

| | | | | |
|---|---|---|---|---|
| 4,433,342 A | * | 2/1984 | Patel et al. | 257/2 |
| 5,687,112 A | * | 11/1997 | Ovshinsky | 365/163 |
| 5,933,365 A | * | 8/1999 | Klersy et al. | 365/148 |
| 6,482,741 B1 | | 11/2002 | Ueno | |
| 6,486,065 B2 | | 11/2002 | Vyvoda et al. | |
| 6,511,645 B1 | | 1/2003 | Nesbitt et al. | |
| 6,642,107 B2 | | 11/2003 | Seo et al. | |
| 6,649,969 B2 | | 11/2003 | Tsuji et al. | |
| 6,683,322 B2 | | 1/2004 | Jackson et al. | |
| 6,689,644 B2 | | 2/2004 | Johnson | |
| 6,930,909 B2 | * | 8/2005 | Moore et al. | 365/148 |
| 6,951,764 B2 | * | 10/2005 | Andideh | 438/3 |
| 7,026,702 B2 | * | 4/2006 | Krieger et al. | 257/464 |
| 2003/0045049 A1 | * | 3/2003 | Campbell et al. | 438/237 |
| 2005/0265072 A1 | * | 12/2005 | Hart et al. | 365/163 |

OTHER PUBLICATIONS

E. G. Gerstner et al. "Nonvolatile memory effects in nitrogen doped tetrahedral amorphous carbon thin films," Journal of Applied Physics, vol. 84, No. 10, Nov. 15, 1998, pp. 5647-5651.

* cited by examiner

*Primary Examiner*—Tu-Tu Ho
(74) *Attorney, Agent, or Firm*—Dickstein Shapiro LLP

(57) ABSTRACT

A resistance variable memory element and a method for forming the same. The memory element has an amorphous carbon layer between first and second electrodes. A metal-containing layer is formed between the amorphous carbon layer and the second electrode.

44 Claims, 8 Drawing Sheets

AMORPHOUS CARBON-BASED NON-VOLATILE MEMORY

FIELD OF THE INVENTION

The invention relates to the field of memory elements, and in particular to amorphous carbon-based non-volatile memory element.

BACKGROUND OF THE INVENTION

Resistance variable memory elements, which include Programmable Conductive Random Access Memory (PCRAM) elements, have been investigated for suitability as semi-volatile and non-volatile random access memory elements. A typical PCRAM device is disclosed in U.S. Pat. No. 6,348,365, which is assigned to Micron Technology, Inc.

A PCRAM device typically includes chalcogenide glass as the active switching material. A conductive material, such as silver, is incorporated into the chalcogenide glass creating a conducting channel. During operation of the device, the conducting channel can receive and expel metal ions (e.g., silver ions) to program a particular resistance state (e.g., a higher or a lower resistance state) for the memory element through subsequent programming voltages, such as write and erase voltages. After a programming voltage is removed, the programmed resistance states can remain intact for an indefinite period, generally ranging from hours to weeks. In this way, the typical chalcogenide glass-based PCRAM device functions as a variable resistance memory having at least two resistance states, which define two respective logic states.

A chalcogenide glass-based device, however, can become unstable at higher temperatures. Accordingly, it is desired to have a resistance variable memory element based on materials other than chalcogenide glass, particularly a material that would provide improved thermal stability.

BRIEF SUMMARY OF THE INVENTION

Exemplary embodiments of the invention include a resistance variable memory element and a method for forming the same. The memory element has an amorphous carbon layer between first and second electrodes. A metal-containing layer is formed between the amorphous carbon layer and the second electrode.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

Figure 1:
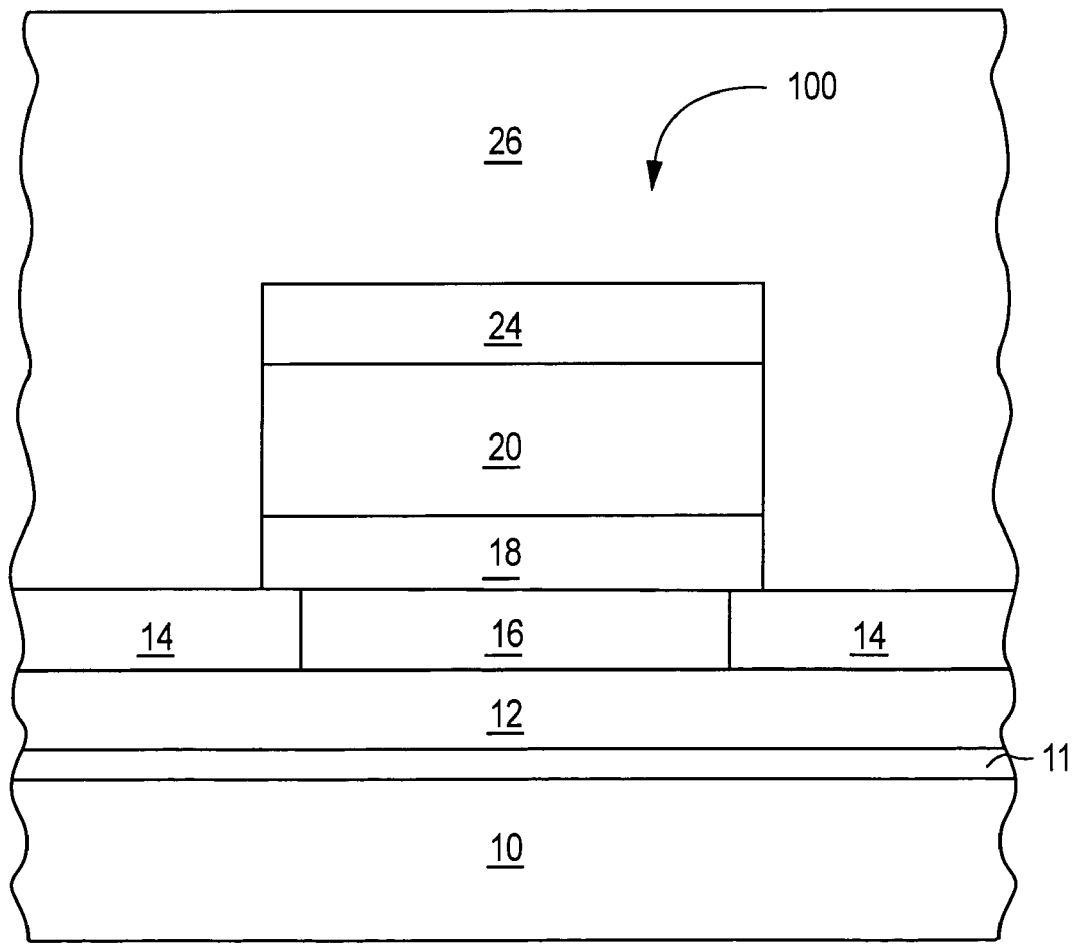
FIG. 1 illustrates a cross sectional view of a memory element according to an exemplary embodiment of the invention.

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a semiconductor substrate that has an exposed substrate surface. A semiconductor substrate should be understood to include silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation. The substrate need not be semiconductor-based, but can be any support structure suitable for supporting an integrated circuit. For example, the substrate can be ceramic or polymer-based.

The term "silver" is intended to include not only elemental silver, but silver with other trace metals or in various alloyed combinations with other metals as known in the semiconductor industry, as long as such silver alloy is conductive, and as long as the physical and electrical properties of the silver remain unchanged.

The term "silver-selenide" is intended to include various species of silver-selenide, including some species which have a slight excess or deficit of silver, for instance, $Ag_{2+/-x}Se$, where x is within the range of approximately 0 to approximately 1. Likewise, the term "tin-selenide" is intended to include various species of tin-selenide, including some species which have a slight excess or deficit of tin, for instance, $Sn_{1+/-x}Se$, where x is within the range of approximately 0 to approximately 1. Also, the term "antimony-selenide" is intended to include various species of antimony-selenide, including some species which have a slight excess or deficit of antimony, for instance, $Sb_{2+/-x}Se_3$ or $Sb_{2+/-x}Se_5$, where x is within the range of approximately 0 to approximately 1.

The term "resistance variable memory element" is intended to include any memory element that exhibits a programmable resistance change in response to an applied voltage.

Exemplary embodiments of the invention include a resistance variable memory element including amorphous carbon as the active switching material (i.e., the material that switches states, which corresponds to logical ones and zeros). As is known, amorphous carbon has a non-crystalline structure including $sp^2$ and $sp^3$ hybridized carbon. The ratio of $sp^2$ to $sp^3$ hybridized carbon can vary. According to exemplary embodiments of the invention, the amount of $sp^3$ carbon is greater than the amount of $sp^2$ hybridized carbon. Unlike a typical chalcogenide-based device, it has been experimentally shown that a memory element according to the invention is able to withstand very high temperatures (e.g., greater than 260° C.) for at least 30 minutes.

FIG. 1 depicts a first exemplary embodiment of a memory element 100 constructed in accordance with the invention. The device 100 shown in FIG. 1 is supported by a substrate 10. Over the substrate 10, though not necessarily directly so, is a conductive address line 12. The address line 12 serves as an interconnect for the element 100 and a plurality of other similar devices of a portion of a memory array of which the memory element 100 is a part of. The conductive address line 12 can be any material suitable for providing an interconnect line, such as doped polysilicon, silver (Ag), gold (Au), copper (Cu), tungsten (W), nickel (Ni), aluminum (Al), platinum (Pt), titanium (Ti), among other materials. As shown in FIG. 1, an optional insulating layer 11 can be between the address line 12 and the substrate 10.

Over the address line 12 is an insulating layer 14 patterned to define areas for a first electrode 16. The first electrode 16 can be any suitable conductive material. According to one exemplary embodiment, the first electrode 16 is tungsten. Desirably, the insulating layer 14 is formed of a material that does not allow the migration of silver ions. For example, the insulating layer 14 can be a nitride, such as silicon nitride ($Si_3N_4$); a low dielectric constant material; an insulating glass; an insulating polymer; among other materials.

As shown in FIG. 1, a layer of amorphous carbon 18 is over the first electrode 16. The layer 18 is preferably between about 100 Å and about 500 Å thick, most preferably about 300 Å thick. The amorphous carbon layer 18 is in electrical contact with the underlying first electrode 16. Over the amorphous carbon layer 18 is a metal-containing layer 20. In the exemplary embodiment depicted in FIG. 1, the metal-containing layer 20 is a layer of silver (Ag). It is also possible that other metal containing layers may be substituted for a silver layer, such as, for example, a layer of tin-selenide (SnSe), antimony-selenide (SbSe), or silver-selenide (AgSe).

Over the silver layer 20 is a second electrode 24. The second electrode 24 can be any suitable conductive material. According to one exemplary embodiment, the second electrode 24 is tungsten and according to another embodiment the second electrode is silver.

While not wishing to be bound by any specific theory, it is believed that upon application of a conditioning voltage, it is believed that metal ions from the metal containing layer 20 (e.g., a silver layer) form one or more conducting channels within the amorphous carbon layer 18. Specifically, it is believed that upon the application of a conditioning voltage, a silver ion enters the amorphous carbon layer 18 and donates an electron to a carbon-to-carbon double bond between $sp^2$ hybridized carbon atoms. Accordingly, the $sp^2$ hybridized carbon atoms allow the formation of the conducting channels, while the $sp^3$ hybridized carbon atoms provide stability.

In the exemplary embodiment of FIG. 1, the conditioning voltage alters the resistance state of the amorphous carbon layer 18 from a high resistance state to a medium resistance state. A subsequently applied write voltage with a lower energy than that of the conditioning voltage can then program the amorphous carbon to a lower resistance state. The application of the write voltage causes available metal ions (e.g., silver ions) to move into the conducting channels where they remain after the write voltage is removed forming conductive pathways. The memory element 100 operates as a write once memory element. Operation of the memory element 100 is described in more detail below in connection with FIGS. 3A–3C.

FIGS. 2A–2D are cross sectional views of a wafer depicting the formation of the memory element 100 according to an exemplary embodiment of the invention. No particular order is required for any of the actions described herein, except for those logically requiring the results of prior actions. Accordingly, while the actions below are described as being performed in a general order, the order is exemplary only and can be altered if desired. Although the formation of a single memory element 100 is shown, it should be appreciated that the memory element 100 can be one memory element in an array of memory elements, which can be formed concurrently.

Figure 2A:
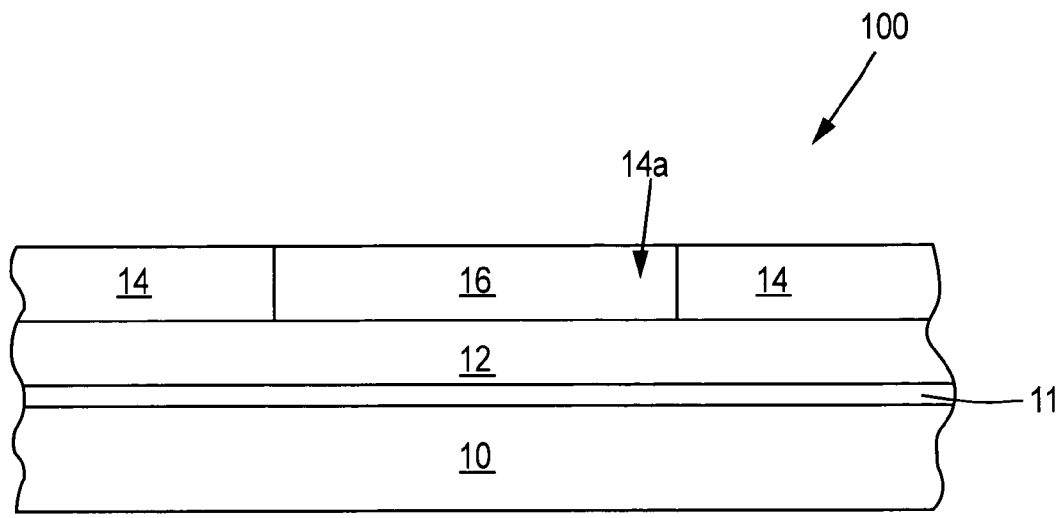
FIGS. 2A–2D illustrate cross-sectional views of the memory element of FIG. 1 at different stages of processing.

As shown by FIG. 2A, a substrate 10 is initially provided. As indicated above, the substrate 10 can be semiconductor-based or another material useful as a supporting structure as is known in the art. If desired, an optional insulating layer 11 may be formed over the substrate 10. The optional insulating layer 11 may be silicon oxide, silicon nitride, or other insulating materials used in the art. Over the substrate 10 (and optional insulating layer 11, if desired), the conductive address line 12 is formed by depositing a conductive material, such as doped polysilicon, aluminum, platinum, silver, gold, nickel, titanium, but preferably tungsten. The conductive material is patterned, for instance with photolithographic techniques, and etched to define the address line 12. The conductive material maybe deposited by any technique known in the art, such as sputtering, chemical vapor deposition, plasma enhanced chemical vapor deposition, evaporation, or plating.

An insulating layer 14 is formed over the address line 12. The insulating layer 14 can be silicon nitride, a low dielectric constant material, or other suitable insulators known in the art, and may be formed by any method known in the art. Preferably, the insulating layer 14 (e.g., silicon nitride) does not allow silver ion migration. An opening 14a in the insulating layer 14 is made, for instance by photolithographic and etching techniques, exposing a portion of the underlying address line 12. A first electrode 16 is formed within the opening 14a, by forming a layer of conductive material over the insulating layer 14 and in the opening 14a. A chemical mechanical polishing (CMP) step is performed to remove the conductive material from over the insulating layer 14. Desirably, the first electrode 16 is formed of tungsten, but any suitable conductive material can be used.

Figure 2B:
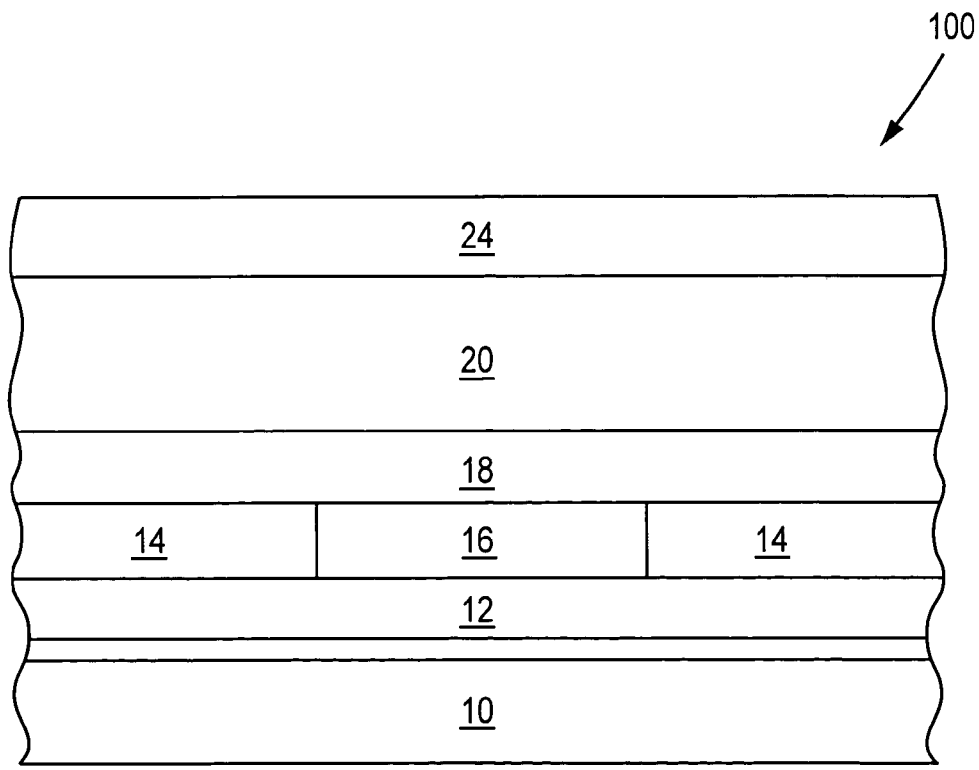

As shown in FIG. 2B, an amorphous carbon layer 18 is formed over the first electrode 16 and insulating layer 14. Formation of the amorphous carbon layer 18 may be accomplished by any suitable method. The amorphous carbon layer 18 is formed having a greater amount of $sp^3$ hybridized carbon than $sp^2$ hybridized carbon.

A metal-containing layer 20 is formed over the amorphous carbon layer 18. The metal-containing layer can be, for example, silver, silver-selenide, tin-selenide, antimony-selenide, or other suitable metal containing layer. In this exemplary embodiment the metal-containing layer is formed as a silver layer. The silver layer 20 can be formed by any suitable method, e.g., physical vapor deposition, chemical vapor deposition, co-evaporation, sputtering, among other techniques.

A conductive material is deposited over the silver layer 20 to form a second electrode 24. Similar to the first electrode 16, the conductive material for the second electrode 24 may be any material suitable for a conductive electrode. In one exemplary embodiment the second electrode 24 is tungsten and in another exemplary embodiment the second electrode 24 is silver. When the second electrode 24 is silver, the second electrode 24 can serve as the metal-containing layer 20 and a separate metal-containing layer 20 can be eliminated.

Figure 2C:
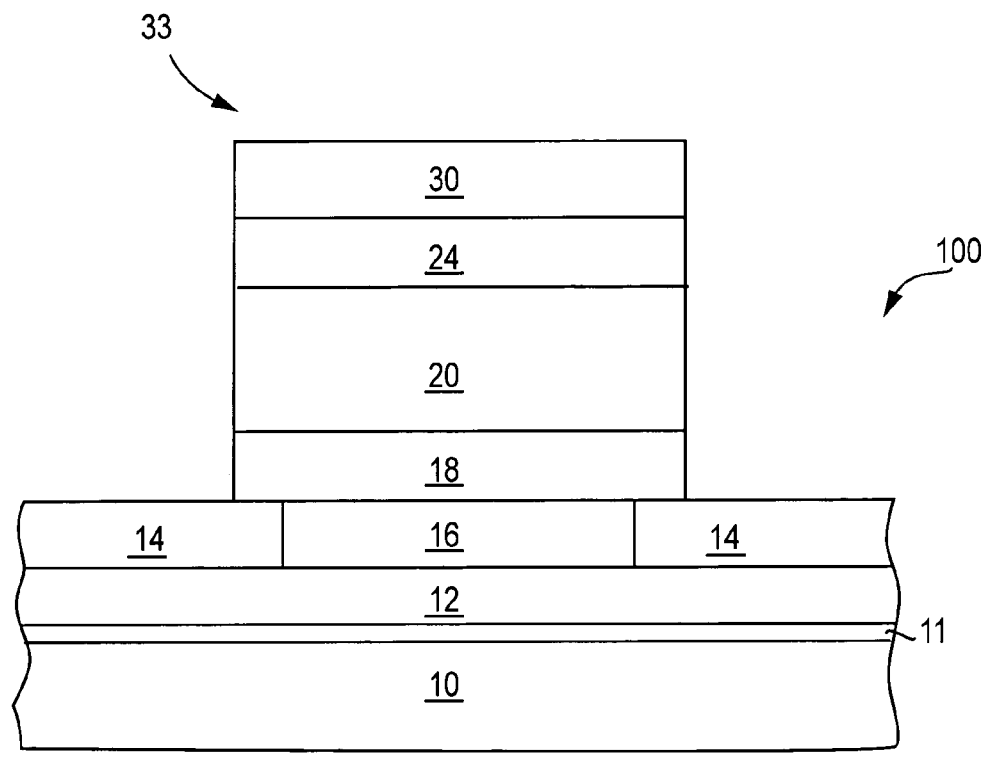
Figure 2D:
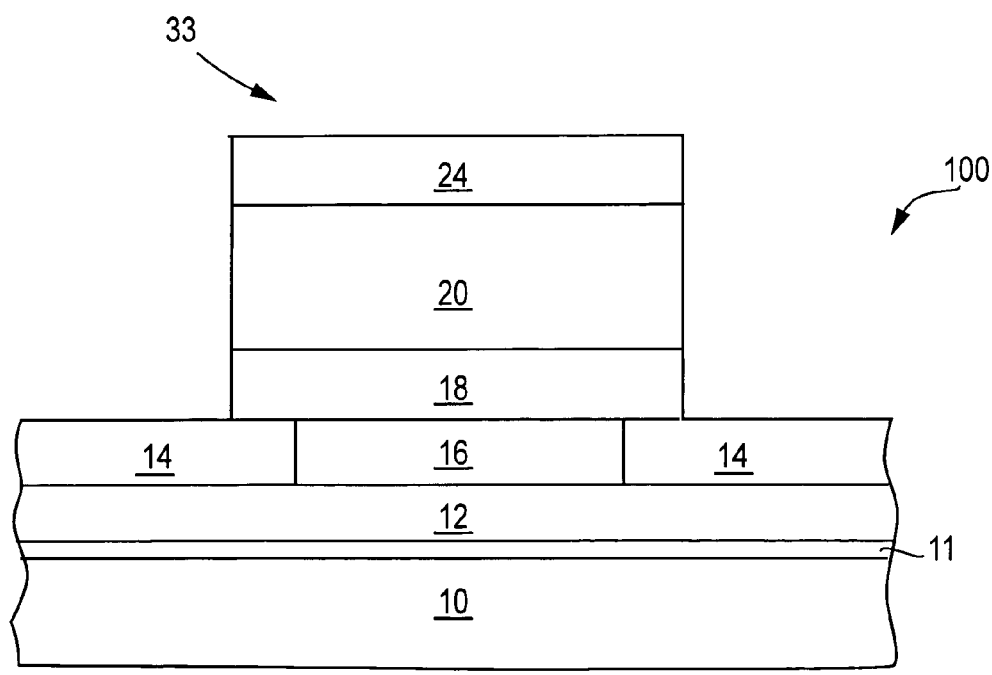

Referring to FIG. 2C, a layer of photoresist 30 is deposited over the second electrode 24 layer, masked and patterned to define a stack 33 of the memory element 100. An etching step is used to remove portions of the layers 18, 20, 24, with the insulating layer 14 used as an etch stop, leaving stack 33 as shown in FIG. 2C. The photoresist 30 is removed, leaving the structure shown in FIG. 2D.

An insulating layer 26 is formed over the stack 33 and insulating layer 14 to achieve the structure shown in FIG. 1. This isolation step can be followed by the forming of connections to other circuitry of the integrated circuit (e.g., logic circuitry, sense amplifiers, etc.) of which the memory element 100 is a part, as is known in the art.

Figure 3A:
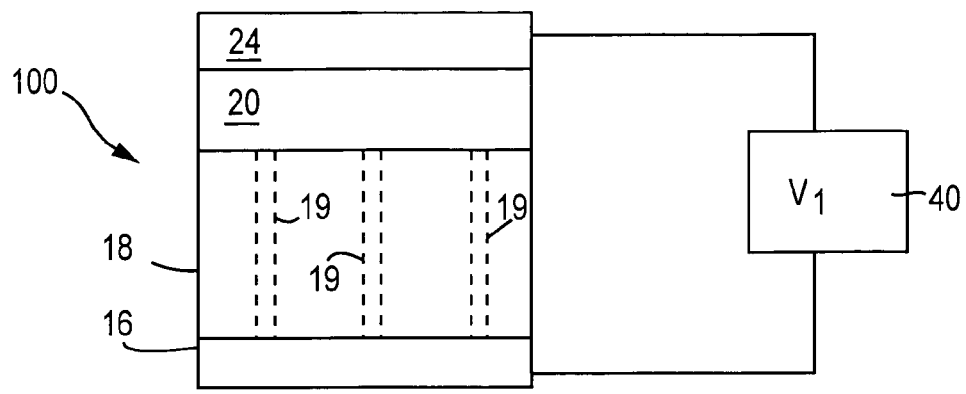
FIGS. 3A–3C illustrate the operation of the memory element of FIG. 1.
Figure 3B:
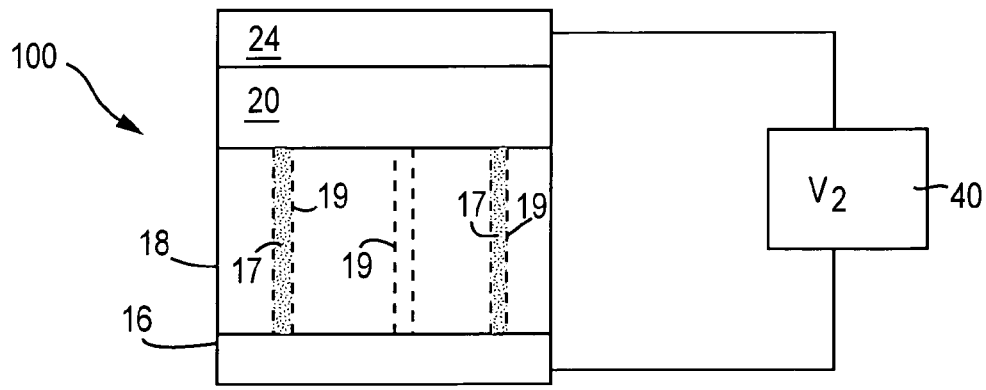
Figure 3C:
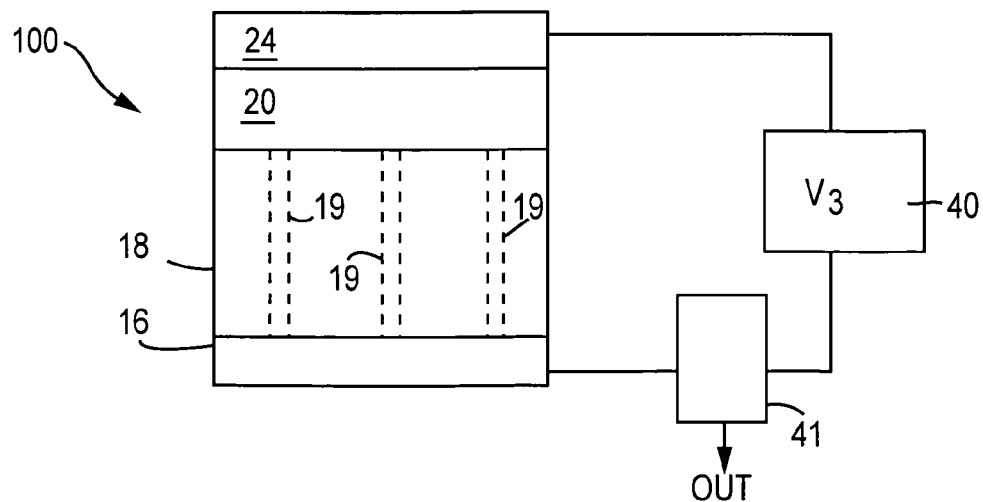

FIGS. 3A–3C depict the operation of the memory element 100 (FIG. 1). In an exemplary embodiment of the invention, the memory element 100 operates as a "write once" memory element 100. The operation of a memory element 100 having a silver layer as the metal-containing layer 20 is described in connection with FIGS. 3A–3C. It should be understood that the operation of a memory element 100 having a metal-containing layer 20 of a different material (e.g., silver-selenide, tin-selenide, or antimony-selenide) would operate in an analogous manner.

In the exemplary embodiment of FIG. 1, once the memory element 100 is formed and prior to a conditioning step, the memory element 100 is in a high state of resistance. As shown in FIG. 3A, a conditioning step is performed by applying a voltage pulse of a given duration and magnitude using, for example, a voltage source 40. It is believed that application of the conditioning voltage causes silver ions from the silver layer 20 to be incorporated into the amorphous carbon layer 18 to form one or more conducting channels 19 in the amorphous carbon layer 18. Each conducting channel 19 can support a conductive pathway 17 (FIG. 3B) during operation of the memory element 100. After application of the conditioning pulse, memory element 100 is in a medium state of resistance.

In the medium resistance state, the memory element 100 is still considered OFF. Once in a medium resistance state, the memory element 100 remains OFF until a conducting channel 19 receives excess silver ions from the silver layer 20 forming a conductive pathway 17 during a write operation.

Referring to FIG. 3B, during a write operation, excess silver ions from the silver layer 20 are believed to enter one or more of the conducting channels 19 within the amorphous carbon layer 18 forming a low resistance conductive pathway 17. A write mode exists when a voltage $V_2$ less than the conditioning voltage $V_1$ is applied across memory element 100, thereby generating an ON (low resistance) state for memory element 100.

During a write operation the silver ions migrate toward the negative potential, here, the first electrode 16, when applied across the memory element 100. The silver ions take the path of least resistance into the amorphous carbon layer 18, which is provided by the conducting channels 19. The movement of the silver ions into a conducting channel 19 forms a low resistance conductive pathway 17.

A read operation is conducted by applying a read potential $V_3$, which is less than write potential $V_2$, to the memory element 100. In the exemplary embodiment depicted in FIG. 3C, the read potential $V_3$ is applied to the memory element 100, which is in an OFF state (FIG. 3A). Current flow through the memory element 100 can be sensed by a current sensing amplifier 41, which can provide an output representing the resistance state of the memory element 100. The read voltage $V_3$ does not disturb other memory elements in a memory element array, which are in the medium resistance OFF state (FIG. 3A), since the read voltage $V_3$ is lower than the write voltage $V_2$.

Figure 4:
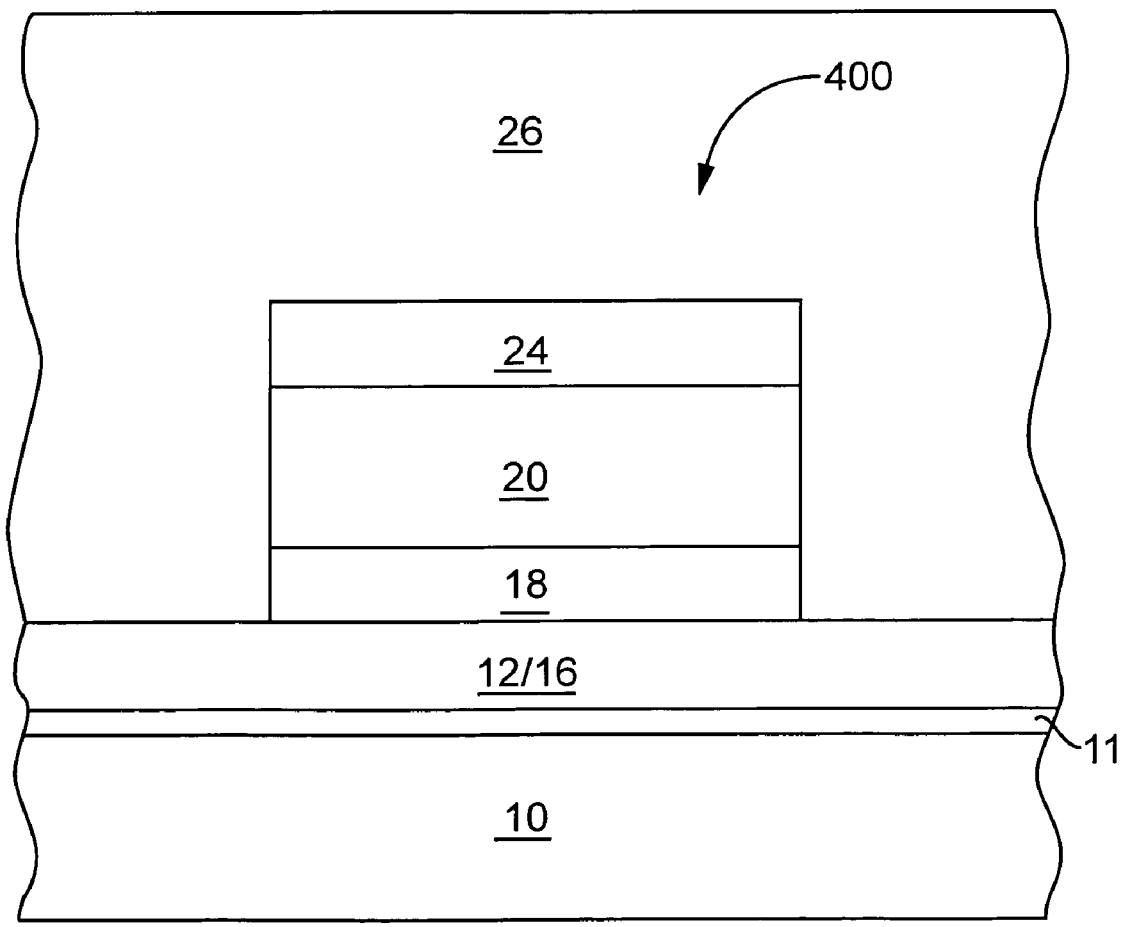
FIG. 4 illustrates a cross sectional view of a memory element according to another exemplary embodiment of the invention.

FIG. 4 shows a memory element 400 according to another exemplary embodiment of the invention. The memory element 400 is similar to memory element 100 (FIG. 1), except that the memory element 400 does not have a first electrode 16 separate from an address line 12. The memory element 400 utilizes a combined address line and electrode structure 12/16, allowing the memory element 400 to be more simple in design and fabricated in fewer steps than the memory element. The address line and electrode structure 12/16 may be the same materials as discussed above for either the address line 12 or first electrode 16. The memory element 400 can be formed and operated in a similar manner to the memory element 100 as described above in connection with FIGS. 3A–3C.

Figure 5:
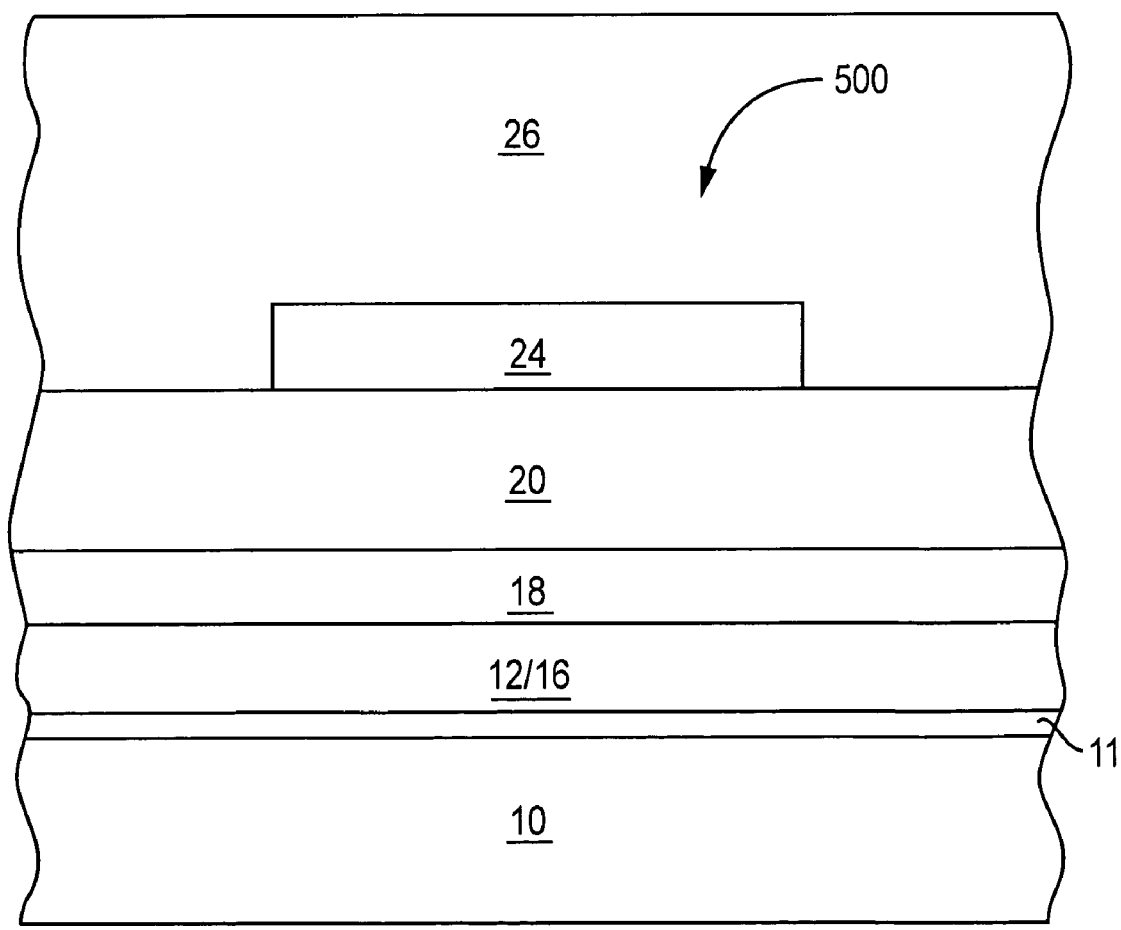
FIG. 5 illustrates a cross sectional view of a memory element according to another exemplary embodiment of the invention.

FIG. 5 illustrates a memory element 500 according to another exemplary embodiment of the invention. The memory element 500 is predominantly defined by the position of the second electrode 24. The layers 18, 20 of the memory element 500 are blanket layers formed over a combined address line and electrode structure 12/16. Alternatively, a first electrode 16 that is separate from an underlying address line 12 can be used, as with memory element 100 (FIG. 1). In FIG. 5, the second electrode 24 is shown perpendicular to the plane of the page and the address line and electrode structure 12/16 is shown parallel to the plane of the page.

The location where the second electrode 24 is directly over the address line and electrode structure 12/16 defines the position of the conducting channel 19 (FIG. 3A) formation at the conditioning step and the conductive pathway 17 (FIG. 3B) formation during operation of the memory element 500. In this way, the second electrode 24 defines the location of the memory element 500. The memory element 500 can be operated in a similar manner to the memory element 100 as described above in connection with FIGS. 3A–3C.

Figure 6:
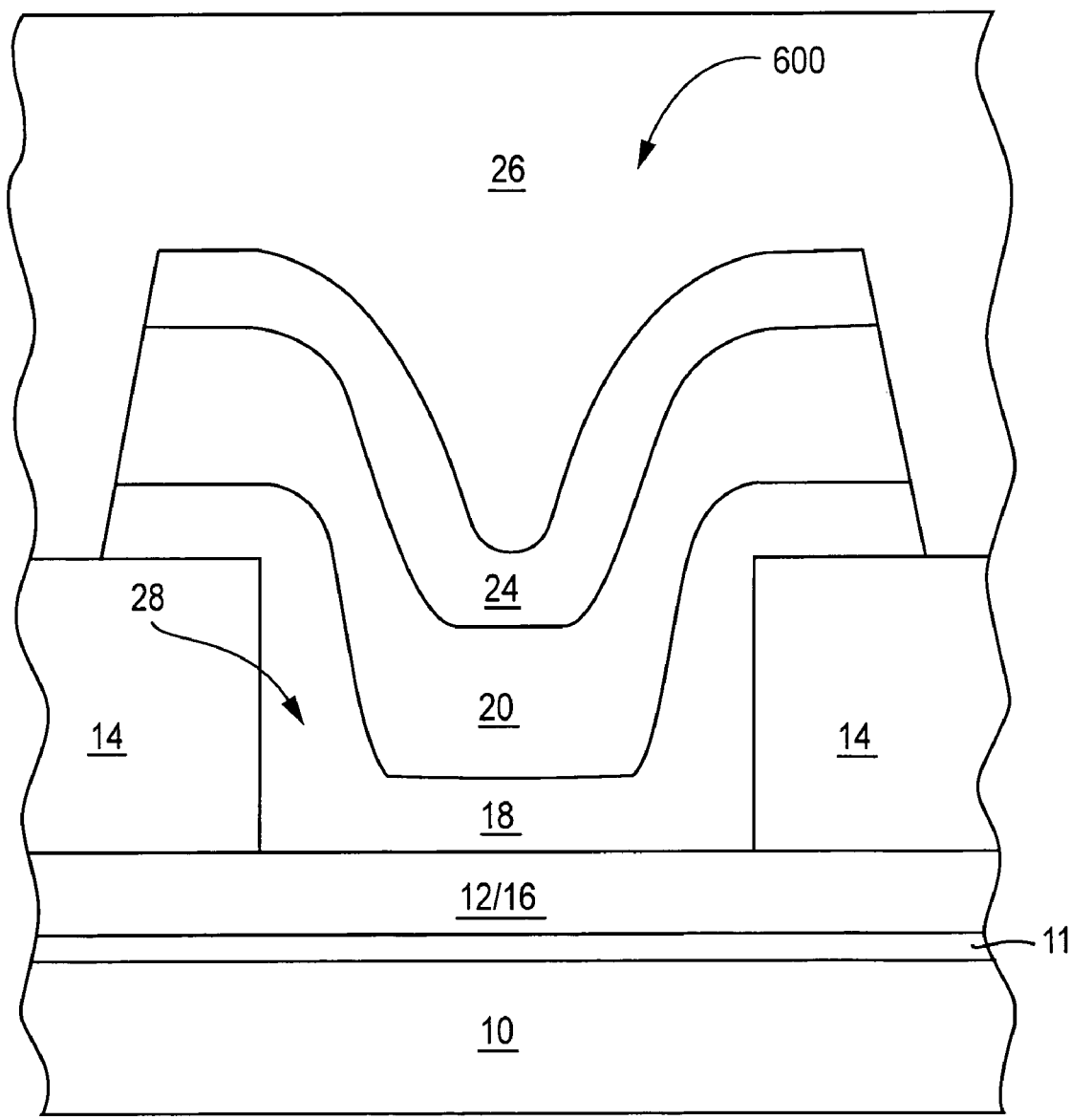
FIG. 6 illustrates a cross sectional view of a memory element according to another exemplary embodiment of the invention.

FIG. 6 represents a memory element 600 according to another exemplary embodiment of the invention. In the illustrated memory element 600, the amorphous carbon and metal-containing layers 18, 20 are formed in a via 28. The via 28 is formed in an insulating layer 14 over an address line and electrode structure 12/16. The layers 18, 20, as well as the second electrode 24, are conformally deposited over the insulating layer 14 and within the via 28. The layers 18, 20, 24 are patterned to define a stack over the via 28, which is etched to form the completed memory element 600. Alternatively, a first electrode 16 that is separate from the underlying address line 12 can be used. Such a separate electrode 16 can be formed in the via 28 prior to the formation of the amorphous carbon layer 18. The memory element 600 can be operated in a similar manner to the memory element 100 as described above in connection with FIGS. 3A–3C.

The embodiments described above refer to the formation of only a few possible resistance variable memory element structures (e.g., PCRAM) in accordance with the invention, which may be part of a memory array. It must be understood, however, that the invention contemplates the formation of other memory structures within the spirit of the invention, which can be fabricated as a memory array and operated with memory element access circuits.

Figure 7:
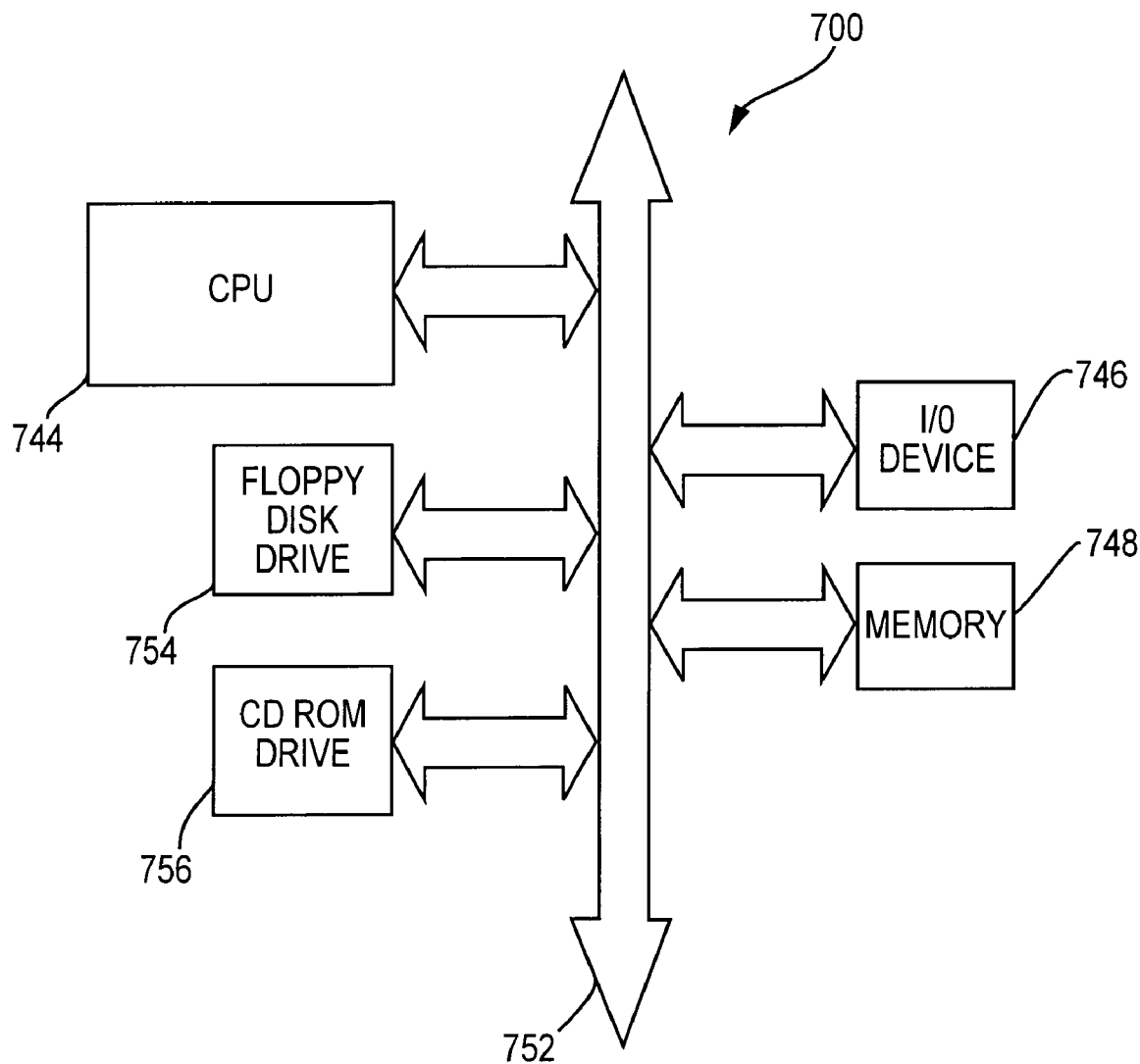
FIG. 7 illustrates a processor system according to an exemplary embodiment of the invention.

FIG. 7 illustrates a processor system 700 which includes a memory circuit 748, e.g., a memory device, which employs resistance variable memory elements (e.g., elements 100, 400, 500, and/or 600) according to the invention. The processor system 700, which can be, for example, a computer system, generally comprises a central processing unit (CPU) 744, such as a microprocessor, a digital signal processor, or other programmable digital logic devices, which communicates with an input/output (I/O) device 746 over a bus 752. The memory circuit 748 communicates with the CPU 744 over bus 752 typically through a memory controller.

In the case of a computer system, the processor system 700 may include peripheral devices such as a floppy disk drive 754 and a compact disc (CD) ROM drive 756, which also communicate with CPU 744 over the bus 752. Memory circuit 748 is preferably constructed as an integrated circuit, which includes one or more resistance variable memory elements, e.g., devices 100 (FIG. 1). If desired, the memory circuit 748 may be combined with the processor, for example CPU 744, in a single integrated circuit.

The above description and drawings are only to be considered illustrative of exemplary embodiments, which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A resistance variable memory element comprising:
    a first electrode;
    a second electrode;
    an amorphous carbon layer between the first electrode and the second electrode; and
    a metal-containing layer between the amorphous carbon layer and the second electrode;
    wherein the metal-containing layer is arranged such that upon application of a voltage, metal ions from the metal-containing layer move into the amorphous carbon layer.

2. The resistance variable memory element of claim 1, wherein the metal-containing layer comprises silver.

3. The resistance variable memory element of claim 1, wherein the metal-containing layer comprises silver-selenide.

4. The resistance variable memory element of claim 1, wherein the metal-containing layer comprises antimony-selenide.

5. The resistance variable memory element of claim 1, wherein the metal-containing layer comprises tin-selenide.

6. The resistance variable memory element of claim 1, wherein the first electrode comprises tungsten.

7. The resistance variable memory element of claim 1, wherein the second electrode comprises tungsten.

8. The resistance variable memory element of claim 1, wherein the second electrode is over the metal-containing layer and comprises silver.

9. The resistance variable memory element of claim 8, wherein the metal-containing layer is silver.

10. The resistance variable memory element of claim 1, wherein the amorphous carbon layer has a greater amount of $sp^3$ hybridized carbon than $sp^2$ hybridized carbon.

11. The resistance variable memory element of claim 1, wherein the amorphous carbon layer and the metal-containing layer are provided within a via in an insulating layer.

12. The resistance variable memory element of claim 1, wherein the amorphous carbon layer and the metal-containing layer are blanket layers over a substrate, and wherein the second electrode defines the location of the memory element.

13. The resistance variable memory element of claim 1, wherein the memory element is a programmable conductive random access memory device.

14. The resistance variable memory element of claim 1, wherein the amorphous carbon layer has a conducting channel therein.

15. The resistance variable memory element of claim 14, wherein the conducting channel comprises material from the metal-containing layer.

16. The resistance variable memory element of claim 1, wherein the formation of a conductive pathway within the amorphous carbon layer programs the memory element to a lower resistance memory state.

17. The resistance variable memory element of claim 16, wherein the conductive pathway comprises at least one of silver, tin, and antimony.

18. The resistance variable memory element of claim 1, wherein the amorphous carbon layer has a greater amount of $sp^3$ hybridized carbon than $sp^2$ hybridized carbon.

19. A memory element, comprising:
    a substrate;
    a conductive address line over the substrate;
    a first electrode over the conductive address line;
    an amorphous carbon layer over the first electrode, the amorphous carbon layer having a greater amount of $sp^3$ hybridized carbon than $sp^2$ hybridized carbon;
    a metal-containing layer over the amorphous carbon layer; and
    a second electrode over the metal-containing layer, wherein the amorphous carbon layer comprises at least one conducting channel, the at least one conducting channel comprising material from the metal-containing layer.

20. The memory element of claim 19, wherein the metal-containing layer comprises silver.

21. The memory element of claim 19, wherein the metal-containing layer comprises silver-selenide.

22. The memory element of claim 19, wherein the metal-containing layer comprises antimony-selenide.

23. The memory element of claim 19, wherein the metal-containing layer comprises tin-selenide.

24. The memory element of claim 19, wherein the first electrode comprises tungsten.

25. The memory element of claim 19, wherein the second electrode comprises tungsten.

26. The memory element of claim 19, wherein the second electrode comprises silver.

27. The resistance variable memory element of claim 26, wherein the metal-containing layer is silver.

28. The memory element of claim 19, wherein the conducting channel incorporates metal ions to form a conductive pathway.

29. The memory element of claim 19, wherein the amorphous carbon layer and the metal-containing layer are provided within a via.

30. The memory element of claim 19, further comprising an insulating layer between the substrate and the conductive address line.

31. The memory element of claim 19, wherein the device is a programmable conductive random access memory device.

32. A processor system, comprising:
a processor; and
a memory device comprising a memory element, the memory element comprising a first electrode, an amorphous carbon layer over the first electrode, a metal-containing layer over the amorphous carbon layer, and a second electrode over the metal-containing layer, wherein the amorphous carbon layer and the metal-containing layer are provided within a via in an insulating layer, wherein the amorphous carbon layer has a conducting channel therein, the conducting channel comprising material from the metal-containing layer.

33. The processor system of claim 32, wherein the amorphous carbon layer has a greater amount of $sp^3$ hybridized carbon than $sp^2$ hybridized carbon.

34. The processor system of claim 32, wherein the metal-containing layer comprises silver.

35. The processor system of claim 32, wherein the metal-containing layer comprises silver-selenide.

36. The processor system of claim 32, wherein the metal-containing layer comprises antimony-selenide.

37. The processor system of claim 32, wherein the metal-containing layer comprises tin-selenide.

38. The processor system of claim 32, wherein the second electrode comprises tungsten.

39. The processor system of claim 32, wherein the second electrode comprises silver.

40. The processor system of claim 32, wherein the memory element is a programmable conductive random access memory device.

41. The processor system of claim 32, wherein the formation of a conductive pathway within the amorphous carbon layer programs the memory element to a lower resistance memory state.

42. The processor system of claim 41, wherein the conductive pathway comprises at least one of tin, silver, and antimony.

43. A resistance variable memory element comprising:
a first electrode;
a silver layer; and
an amorphous carbon layer between the first electrode and the silver layer; and
wherein the silver layer is arranged such that upon application of a voltage, silver ions from the silver layer move into the amorphous carbon layer.

44. The resistance variable memory element of claim 43, wherein the silver layer is a second electrode.

* * * * *